(12) United States Patent
Eden et al.

(10) Patent No.: US 8,957,572 B2
(45) Date of Patent: Feb. 17, 2015

(54) MICROPLASMA JET DEVICES, ARRAYS, MEDICAL DEVICES AND METHODS

(75) Inventors: J. Gary Eden, Champaign, IL (US);
Sung-Jin Park, Champaign, IL (US);
Jin Hoon Cho, Champaign, IL (US);
Jeffrey H. Ma, Darien, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 317 days.

(21) Appl. No.: 13/532,390

(22) Filed: Jun. 25, 2012

(65) Prior Publication Data
US 2015/0008825 A1    Jan. 8, 2015

Related U.S. Application Data

(60) Provisional application No. 61/501,053, filed on Jun. 24, 2011.

(51) Int. Cl.
| | |
|---|---|
| *H05H 1/30* | (2006.01) |
| *H01J 37/32* | (2006.01) |
| *H05H 1/24* | (2006.01) |
| *H01J 9/18* | (2006.01) |

(52) U.S. Cl.
CPC ........ *H01J 37/32467* (2013.01); *H05H 1/2406* (2013.01); *H05H 2001/2418* (2013.01); *H05H 2001/2462* (2013.01); *H01J 9/18* (2013.01); *H01J 37/3244* (2013.01); *H01J 37/32513* (2013.01); *H01J 37/32568* (2013.01)
USPC ............ 313/231.31; 315/111.21; 315/111.31; 219/121.36

(58) Field of Classification Search
USPC ........... 313/582, 231.31, 231.41; 315/111.21, 315/111.31; 219/121.36
See application file for complete search history.

(56) References Cited

U.S. PATENT DOCUMENTS

| | | | |
|---|---|---|---|
| 5,272,417 | A | 12/1993 | Ohmi |
| 6,169,370 | B1 | 1/2001 | Platzer |
| 2002/0092616 | A1 | 7/2002 | Kim |
| 2006/0028145 | A1 | 2/2006 | Mohamed et al. |

OTHER PUBLICATIONS

Burton, Rodney L., et. al. "Initial Development of the Microcavity Discharge Thruster", *The 31st International Electric Propulsion Conference, University of Michigan, USA* Sep. 20-24, 2009.
Cao, Z., et. al., "Atmospheric plasma jet array in parallel electric and gas flow fields for three-dimensional surface treatment", *Applied Physics Letters*, 94 (2009) 021501.

(Continued)

*Primary Examiner* — Joseph L Williams
(74) *Attorney, Agent, or Firm* — Greer, Burns & Crain, Ltd.

(57) ABSTRACT

Preferred embodiments of the present invention include microplasma jet devices and arrays in various materials, and low temperature microplasma jet devices and arrays. These include preferred embodiment single microplasma jet devices and arrays of devices formed in monolithic polymer blocks with elongated microcavities. The arrays can be densely packed, for example having 100 jets in an area of a few square centimeters. Additional embodiments include metal/metal oxide microplasma jet devices that have micronozzles defined in the metal oxide itself. Methods of fabrication of microplasma jet devices are also provided by the invention, and the methods have been demonstrated as being capable of producing tailored micronozzle contours that are unitary with the material insulating electrodes.

25 Claims, 22 Drawing Sheets

(56) References Cited

OTHER PUBLICATIONS de Chadenedes, Mark, et al., "Advances in Microcavity Discharge Thruster Technology", *41st AIAA Plastradynamies and Lasers Conference, and the 5th AIAA Flow Control Conference*, Jun. 28-Jul 1, 2010.

U.S. Appl. No. 12/589,182, filed Oct. 19, 2009, Burton et al.

Burton, Rodney L., et. al., "Initial Development of the Microcavity Discharge Thruster", *The 31st International Electric Propulsion Conference, University of Michigan, USA*, Sep. 20-24, 2009.

De Chadenedes, Mark, et. al., "Advances in Microcavity Discharge Thruster Technology", *American Institute of Aeronautics and Astronautics*, 46th AIAA/ASME/SAE/ASEE Joint Propulsion Conference and Exhibit, Nashville, Tennessee, US, Jul. 25-Jul. 28, 2010.

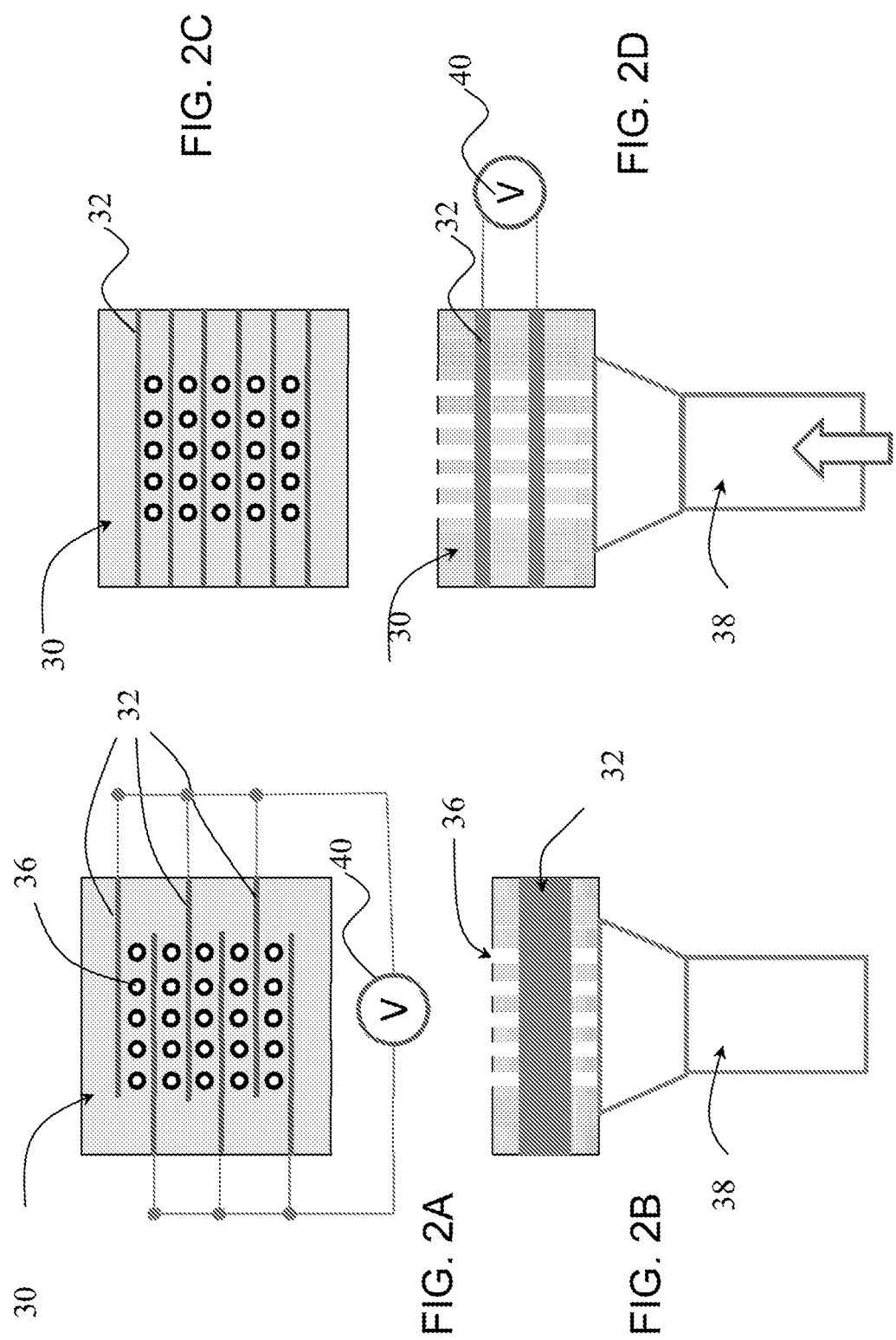

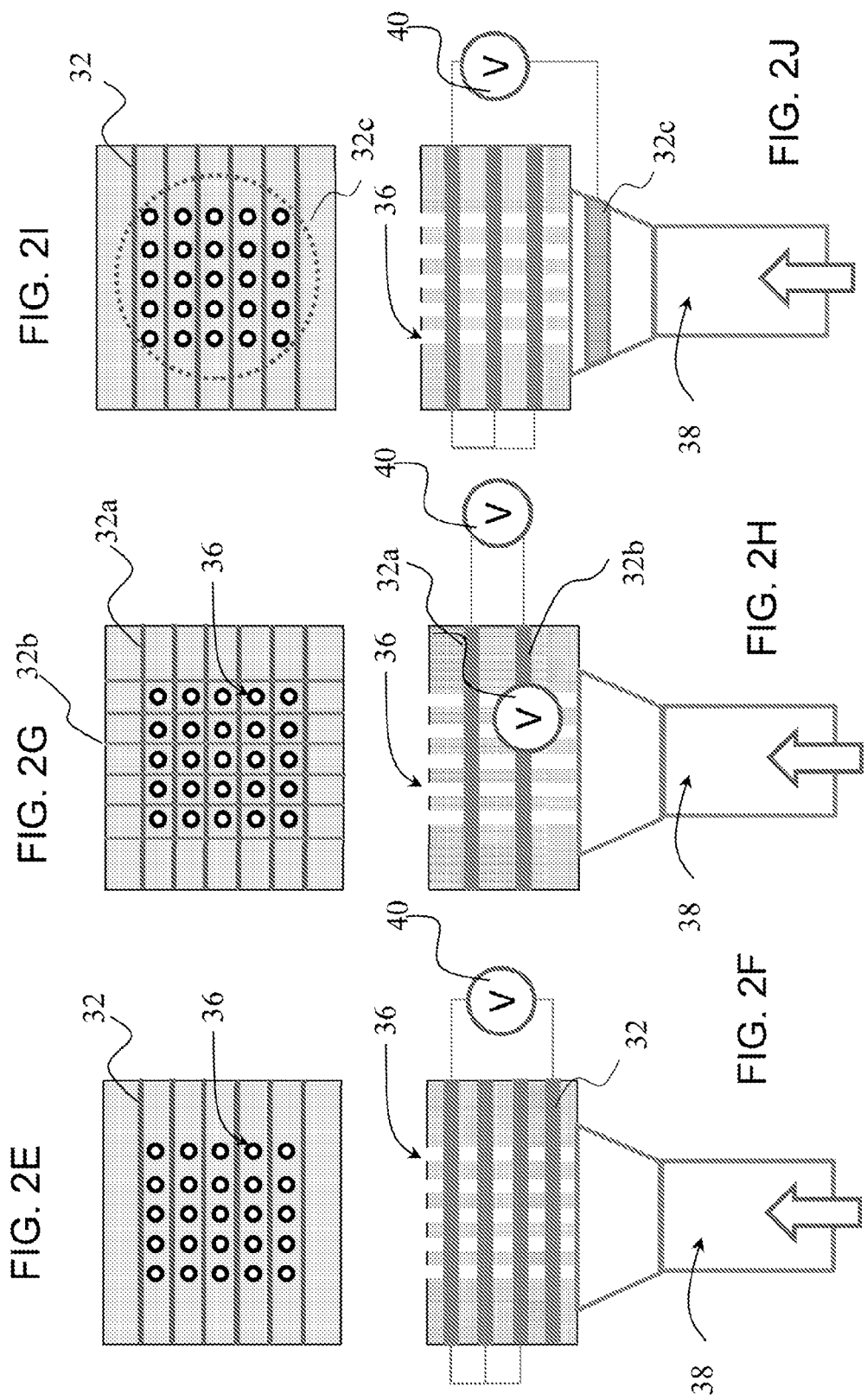

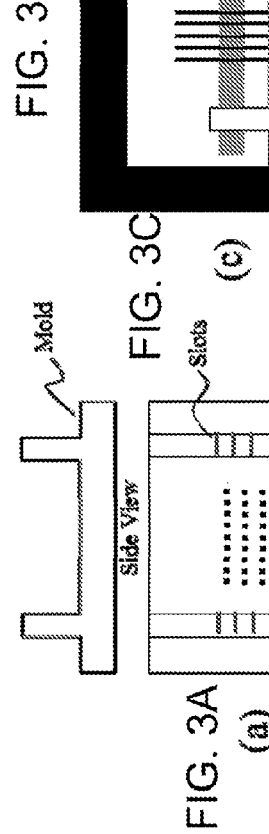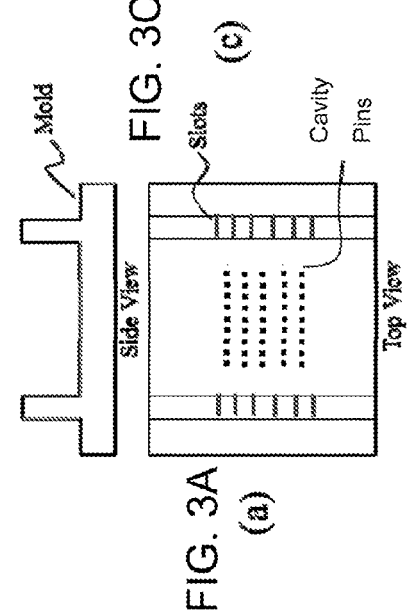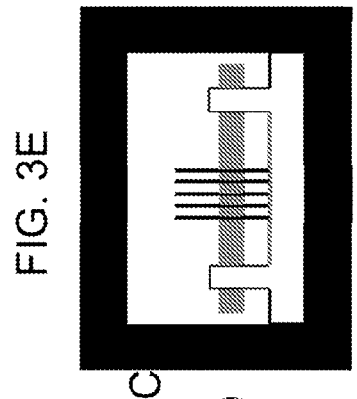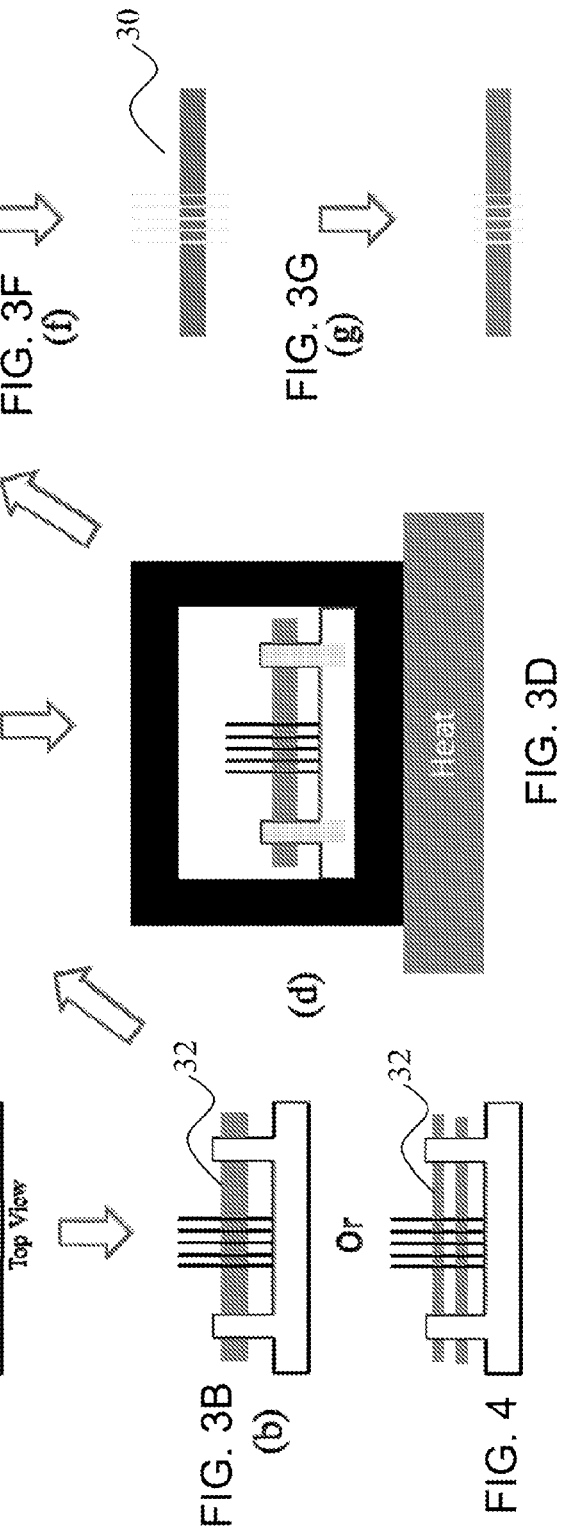

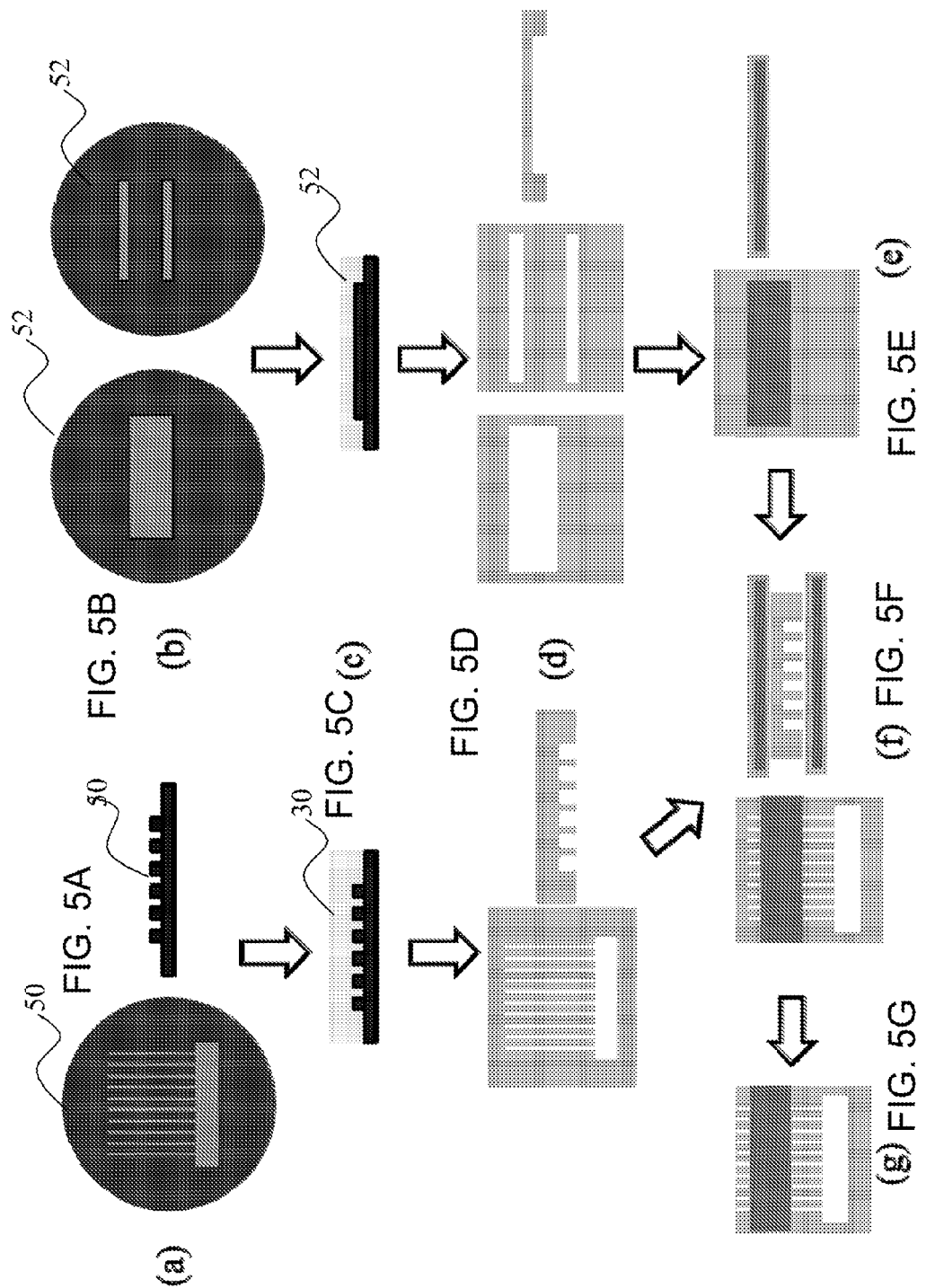

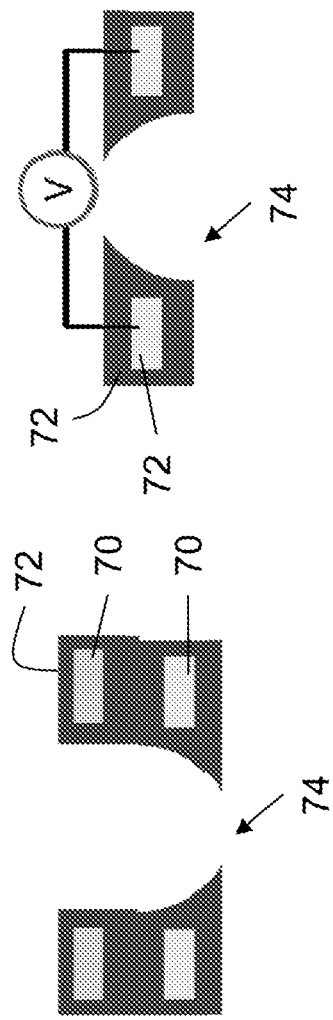
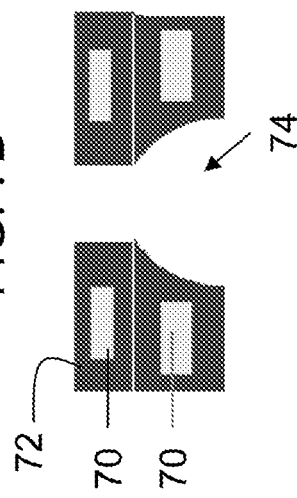
FIG. 7A  FIG. 7B  FIG. 7C  FIG. 7D

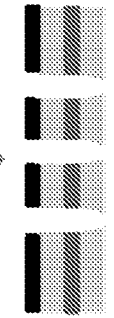
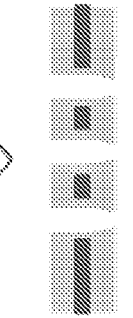
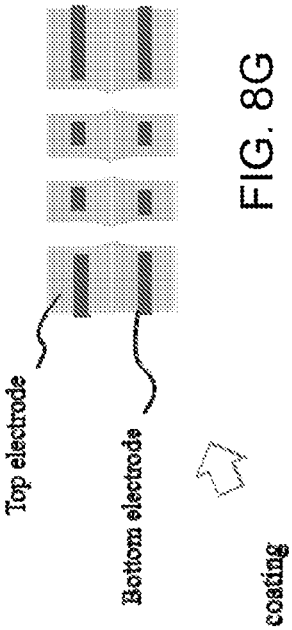
FIG. 8A — Al foil (0.05–0.5 mm)
FIG. 8B — Anodization (in acid); Al₂O₃ / Al
FIG. 8C — Mask Formation (Stamping or Photo Patterning); Mask
FIG. 8D — Microablation (micropowder blasting), Electrochemical Etching, Laser Drilling
FIG. 8E — Mask Removal
FIG. 8F — 2nd Anodization or 2nd dielectric layer coating
FIG. 8G — Top electrode / Bottom electrode

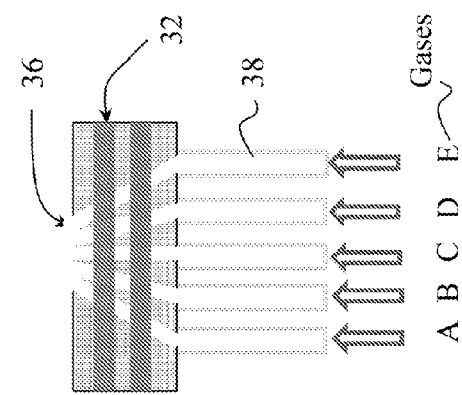
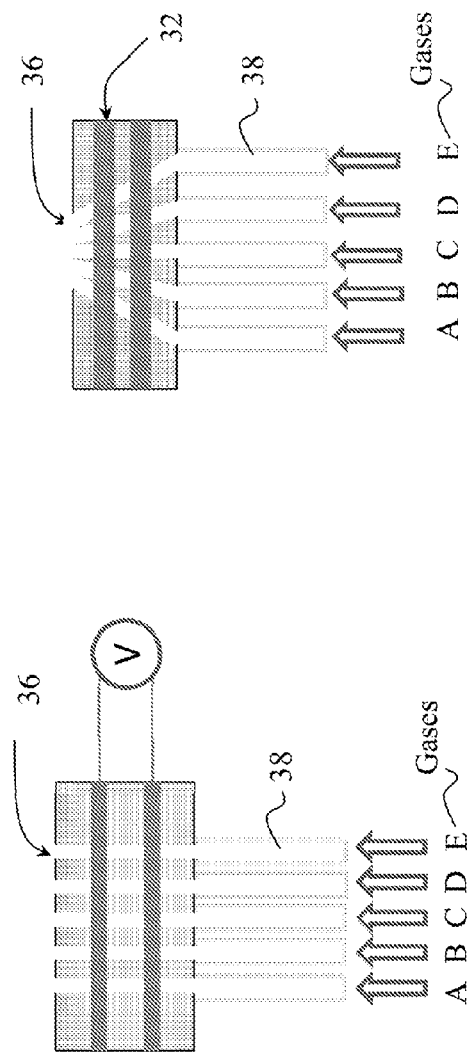
FIG. 18A
FIG. 18B
FIG. 18

MICROPLASMA JET DEVICES, ARRAYS, MEDICAL DEVICES AND METHODS

PRIORITY CLAIM AND REFERENCE TO RELATED APPLICATION

The application claims priority under 35 U.S.C. §119 from prior provisional application Ser. No. 61/501,053, which was filed Jun. 24, 2011.

STATEMENT OF GOVERNMENT INTEREST

This invention was made with government support under Contract No. FA9550-07-1-0003 awarded by the United States Air Force Office of Scientific Research. The government has certain rights in the invention.

FIELD

Fields of the invention include microplasma devices and arrays, particularly devices and arrays based upon microcavity plasma devices but configured to produce an output jet of plasma. Preferred devices produce low temperature plasma and preferred arrays are configured to produce multiple output jets of plasma. Preferred applications of the invention include medical treatment devices, such as an array configured for the treatment of human tissue (skin, muscle, etc.), and plasma processing of surfaces.

BACKGROUND

Microcavity plasma devices and arrays have been developed and advanced by researchers at the University of Illinois, including inventors of this application. Devices and arrays have been fabricated in different materials, such as ceramics and semiconductors. Arrays or microcavity devices have also been fabricated in thin metal and metal oxide sheets. Advantageously, microcavity plasma devices confine plasma in cavities having microscopic dimensions and require no ballast, reflector or heavy metal housing. Microcavities in such devices can have different cross-sectional shapes, but generally confine plasma in a cavity having a characteristic dimension in the range of about 5 µm-500 µm.

FIG. 1 is a schematic diagram of a single plasma jet device of the prior art. A gas supply 10 provides a gas flow through a tube 12 that includes a nozzle exit 14. A power supply 16 powers electrodes 18 and 20, which stimulate plasma generation in the tube 12 and a plasma jet 22 is emitted from the nozzle exit 14. The tube is generally cylindrical and has a typical diameter of several millimeters. The electrodes in such prior devices are generally on the outside of the tube. Several kV are required to produce the plasma jet as a result of the tube diameter, and the tube structures are not readily bundled because they are heavy, and an ensemble of even a few tubes is bulky.

Such previous plasma jet technologies have a number of limitations. First, tubing is often used with diameters that have been large for a single jet, typically on the order of millimeters (mm). Producing a jet in tubing of such a diameter requires very high voltages (many kV) and a high gas flow (typically, several standard liters per minute (SLM)). Another difficulty arises if one wishes to make a plasma source that covers an area as large as possible. "Bundling" a number of tubes together, each of which is itself bulky and heavy, is difficult, and is inconvenient for many applications. For this reason, typical multiple jet assemblies developed in the past are not practical.

Burton et al., "Initial Development of the Microcavity Discharge Thruster," 31st *International Electric Propulsion Conference, University of Michigan, USA* September 20-24, (2009) & Chadenedes et al., "Advances in Microcavity Discharge Thruster Technology," American Institute of Aeronautics and Astronautics (2010) disclose microjet devices formed in two thin foil layers of Al/Al$_2$O$_3$. The layers defined a nozzle in a bowl shape that varied from linear to parabolic in cross-sectional geometry. Chadenedes et al. discloses in FIG. 1 a microjet device formed from two metal/metal oxide electrodes. The electrodes in FIG. 1 form an aligned cylindrical surface (the surfaces are flush) and the micronozzle in FIG. 1 is a separate structure from the metal/metal oxide electrodes. The ability to fabricate such a separate nozzle is not described, and the reliability and manufacturability of such a nozzle is not clear. FIG. 2 of Burton et al., describe a "bell shaped" nozzle microjet devices formed in the metal and metal oxide electrodes. The fabrication of a micronozzle is described as a chemical etching after the metal and metal/oxide foils are combined. The papers, as indicated in Burton et. al are directed to simulations and "proof-of-concept" efforts to produce a thruster for spacecraft. In FIG. 6 of Burton et al, a boron nitride shroud was used at the nozzle and a polyimide coating was used with two electrodes that form an abrupt change in size with a smaller microcavity having a smaller cylindrical microcavity. FIG. 7 of Burton et al shows the bowl/bell shaped nozzle. The "supersonic nozzle" of FIG. 1 or is shown as not being unitary with either of the electrodes. Moderate efficiencies are reported on page 7 for providing thrust by Burton et al., which proposes improvements might be achieved by "by coupling to a micronozzle for which performance has been characterized" and "the efficiency of the thruster can be further increased with improvements to the manufacturing process." No solution is proposed in Burton for coupling a nozzle with optimal contours that are discussed on page 7 as being desirable.

SUMMARY OF THE INVENTION

Preferred embodiments of the present invention include microplasma jet devices and arrays in various materials, and low temperature microplasma jet devices and arrays. These include preferred embodiment single microplasma jet devices and arrays of devices formed in monolithic polymer blocks with elongated microcavities. The arrays can be densely packed, for example having 100 jets in an area of a few square centimeters. Additional embodiments include metal/metal oxide microplasma jet devices that have micronozzles defined in the metal oxide itself. Methods of fabrication of microplasma jet devices are also provided by the invention, and the methods have been demonstrated as being capable of producing tailored micronozzle contours that are unitary with the material insulating electrodes.

BRIEF DESCRIPTION OF THE DRAWINGS

FIGS. 2A-B and 2C-2D are multiple views of a preferred embodiment arrays of low temperature microplasma jet devices of the invention;

FIGS. 2E-2J are multiple views of additional preferred embodiment arrays of low temperature microplasma jet devices of the invention;

FIGS. 3A-3G and FIG. 4 illustrated preferred fabrication processes for manufacturing microplasma jet arrays such as the arrays in FIGS. 2A-2D;

FIGS. 5A-5G illustrate another preferred embodiment method for fabrication of an array of microplasma jet devices in a solid block of polymer;

FIGS. 7A-7E illustrate several plasma nozzle geometries and exemplary dimensions in general ranges that have been tested in aluminum/aluminum oxide microplasma jet arrays;

FIGS. 8A-8G illustrate preferred fabrication processes for manufacturing microplasma jet arrays such as the arrays in FIGS. 7A-7E

FIGS. 18A and 18B are cross-sectional views of additional preferred embodiment arrays of low temperature microplasma jet devices of the invention.

DETAILED DESCRIPTION OF THE PREFERRED EMBODIMENTS

Figure 1:
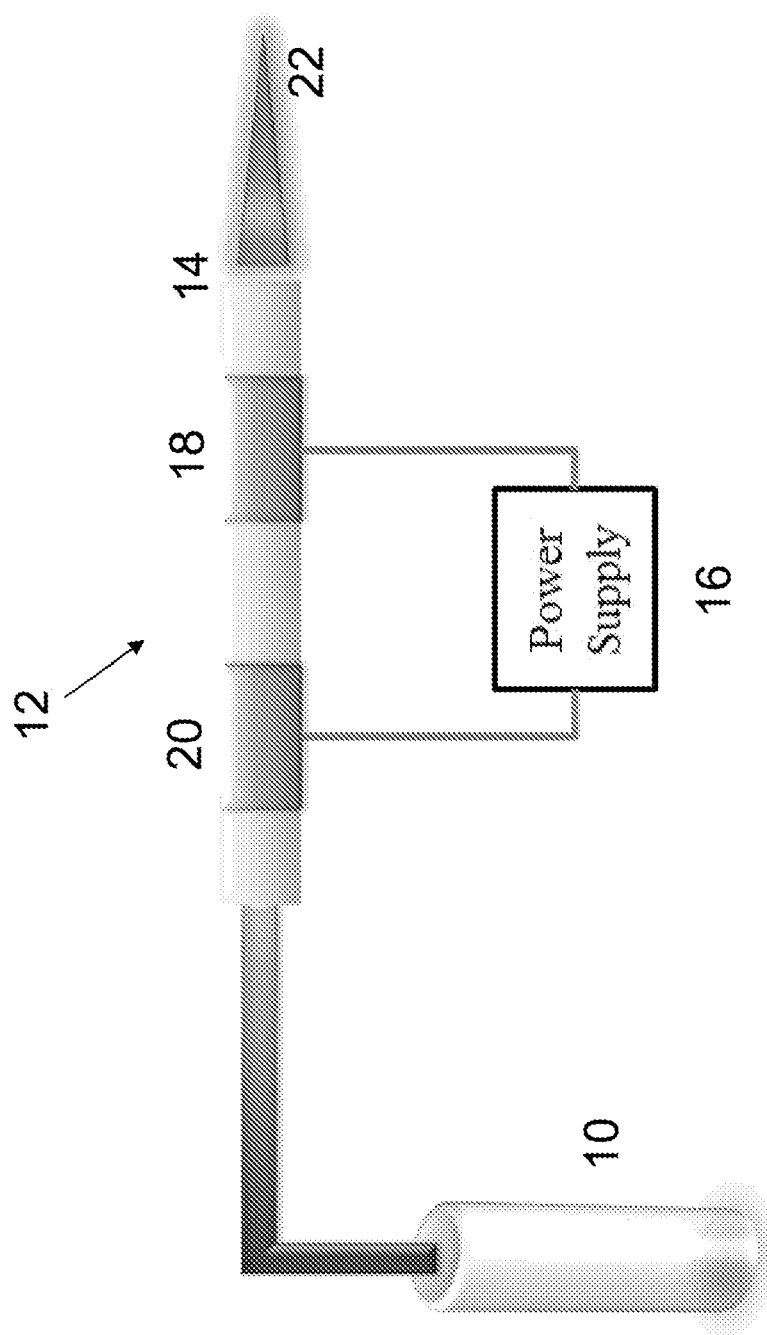
FIG. 1 is a schematic illustrating a microplasma jet (prior art)

This invention provides for one or an array of low temperature microplasma jet devices. Low temperature plasma is emitted in a jet from a micro nozzle that provides the exit from a microcavity. The low temperature plasma jet is suitable for treating human or animal tissue. Other applications include disinfecting or producing a thin film on a temperature-sensitive surface. Preferred embodiment devices are formed in metal and metal oxide, or within a polymer. In the polymer an elongated microcavity provides part of the necessary conditions for producing a controlled plasma jet and in metal and metal oxide embodiments, a smooth contoured micronozzle is defined as a unitary part of the metal that encapsulates electrodes that drive microplasma jet device or devices. Shaped microcavities provide a unitary nozzle exit for the focused ejection of microplasma from a flowing gaseous stream directed through the microcavities while electrodes stimulate and maintain plasma generation. A gas supply provides a flow of one or more feedstock gases or vapors through the microcavities of a plasma device, and a microplasma jet is generated that extends for a substantial distance out of the micronozzle, up to several centimeters in room air.

Nozzles can be fabricated by methods of the invention to have precisely-controlled surfaces that allow for the plasma effluent to have particular properties with regard to temperature and velocity. A power supply provides power to the electrodes. Flexible arrays can be used to form the basis for medical devices that can be shaped in sleeves and collars, for example, to uniformly treat areas of tissue. Other shapes can be formed, including, for example, tubes (cylinders) and balls that emit microplasma jets from their outer portions. The control of cavity shape and use of multiple array layers in preferred fabrication methods also permits that formation of arrays that emit in patterns, such as divergent or convergent patterns. Arrays can be formed to expel microplasma jets along a wide variety of predetermined paths.

The invention also provides for microplasma jet arrays that are formed in a monolithic block of polymer. Electrodes are encapsulated in the monolithic block of polymer, and the polymer is preferably selected to be suitable for contact with human skin, which permits the microplasma jet arrays to be used for the treatment of human tissue. Medical applications include the disinfection of tissue, and wounds, including during surgery, and the promotion of wound and tissue healing. Arrays are also used, for example, for the surface treatment of various inanimate materials, including the curing of polymer films and the deposition of thin films on temperature-sensitive surfaces.

Embodiments of the invention provide practical arrays for important applications that were not contemplated or ill-served by prior devices discussed in the background. Microplasma jets of the invention are realized from microcavity plasma devices that expel plasma well outside of the microcavity in which the plasma is generated and can provide low temperature plasma. For example, plasma might be delivered to a surface well-removed from the cavity. Some applications would benefit from remote processing that can be provided by devices and arrays of the invention, where plasma is extracted and expelled into surrounding environments, including gaseous and liquid environments. Certain medical and surface processing applications can benefit from such efficient microplasma jet devices. Medical and surface processing applications can use constituents of a microplasma jet, namely ions, electrons, radicals and photons, to favorably affect a surface.

Preferred embodiments of the invention will now be discussed with respect to the drawings. The drawings include schematic representations that will be understood by artisans in view of the general knowledge in the art and the description that follows. Features may be exaggerated in the drawings for emphasis, and features may not be to scale. Artisans will recognize broader aspects of the invention from the description of the preferred embodiments.

FIGS. 2A-2D illustrate preferred embodiment arrays of microplasma jet devices of the invention that are formed in polymer 30 that encapsulates electrodes 32 that are encapsulated by the polymer. The polymer 30 also defines elongated microcavities 36. In the invention, an elongated microcavity 36 with encapsulated electrodes serves the general function of the tube 12 and electrodes 18 and 20 of FIG. 1 of the prior art device. The elongated microcavity 36 should have a length to diameter of at least 10:1 to produce a stable flow of plasma and produce a well-defined microjet. The plasma medium and flow conditions also affect the length and quality of the microjet. A plasma medium supply tube 38 provides a flow of plasma medium to the elongated microcavities 36. The plasma medium can be gases or vapors or mixtures thereof. Suitable plasma media include the noble gases and mixtures with $N_2$, $O_2$, air, $H_2$. Flow rates for supply can be, for example from ~0.1 to tens of liters/per minute for a 3×3 array. Current testing shows that the flow rate appears to scale linearly for larger arrays. A power supply 40 provides a time-varying voltage to excite plasma that is discharged for substantial distances from micronozzles at exits of the microcavities opposite the supply tube 38.

The electrodes 32 can be, for example, foils, rods, wires and deposited metal layers. The polymer 30 is formed from thermally curable or UV curable polymers. The diameters of the microcavities 26 can be from 1 μm to about 5 mm and the elongated microcavities 36 can be very long in polymer, being unlimited in practical terms relative to the diameter of the microcavities 36. The electrodes 32 are buried within and encapsulated by the polymer block 30 to isolate them from the elongated microcavities 36 and plasma generated therein, and are connected to the power supply 40 delivering the time-varying voltage V.

Both arrays of FIGS. 2A/2B and 2C/2D include a plurality the elongated microcavities 36 (in this instance, generally circular in cross-section) that are formed in the monolithic "block" of a polymer 30. The microcavities can also have other cross-sections, e.g., rectangular. The polymer 30 is preferably a siloxane that is flexible, transparent, and is approved by the FDA for contact with human skin, which is important for applications of the invention that relate to the treatment of human skin.

With a device or an array of the invention, the shape of the microcavity 36 and micronozzle exit at the end of the microcavity 36 and the gas supplied by the gas supply 38 are preferably selected to ensure that a plasma jet emitted from the microcavities 36 is low temperature (preferably less than 500K and most preferably <100° C. above room temperature, which is achieved with rare gases such as neon and argon), and therefore suitable, for example for contact with human tissue. In addition, the shape of the micronozzle exit 14 preferably provides a convergent jet by focusing the gas flow of an individual device. In addition, devices in arrays can be configured such that the plasma effluent from multiple devices converges, diverges or remains parallel.

The feedstock gas delivered by the gas supply 38 in preferred embodiments can be one or more of a variety of atomic and molecular gases, including the rare gases (He, Ne, Ar, Kr, and Xe) and $N_2$. Production of a plasma in the elongated microcavities 36 generates electrons and ions, as well as exited atoms and molecules that can have internal energies as high as 10-20 eV. Particularly long-lived atomic or molecular states, such as metastable states of the rare gas atoms, are particularly effective in transferring energy to a second, "acceptor" species. The Renning ionization of $N_2$ by the He atom in its metastable state to produce the B state of $N_2^+$ is an important example.

The different between the arrays of FIGS. 2A-B and 2C-2D concern the electrode arrangements. In both embodiments, the elongated microcavities 36 are arranged in rows, and the rows are interleaved with electrodes 32. The electrodes 32 can be formed from metal foil, a wire grid, mesh or a deposited metal layer. Methods of fabrication in the present invention provide for plasma elongated microcavities having diameters in the range of 1 μm to 5 mm to be fabricated. Both embodiments show a 5×5 array of elongated microcavities with an electrode 32 disposed between each row.

FIGS. 2C and 2D show another embodiment with a different electrode configuration. In the array of FIGS. 2C and 2D, the electrodes 32 are arranged in two groups. Such an arrangement allows for the voltage to be applied longitudinally—that is, parallel to the gas flow stream. The different electrode configurations of FIGS. 2A-2D allow for the electrical power to be coupled into plasma medium in the microcavities 36 in different ways, thereby altering properties of microplasmas generated therein.

The plasma produced in preferred microplasma jet devices of the invention are low temperature plasmas in which the electron temperature is much higher than the gas temperature. Experiments indicate that the electron temperature of plasma in microcavities of microplasma jet devices of the invention is higher than that of the plasma stream emerging from the exit of the device. Within the plasma effluent, energetic species (such as metastable atoms and molecules) are also propelled with the jet and radiation (including, for example, in the visible range and short wavelength ultraviolet range) is also generated. These species and the ultraviolet light that can be produced by the plasma are lethal to many (virtually all) bacteria and viruses and, hence, the interest of many researchers in disinfection.

Additional embodiments illustrated in FIGS. 2E-2J also show a 5×5 microplasma jet array. These embodiments differ only in their electrode configuration. All are formed in polymer blocks as described above. The array in FIG. 2F has a similar electrode configuration to the embodiment of FIG. 2C, in that electrodes 32 in the same vertical plane are electrically connected, with FIG. 2F showing 4 sets of electrodes 32 in vertical planes. In FIG. 2F, the 3 sets of electrode columns are electrically connected as group and a time varying-voltage is applied between the group and the $4^{th}$ set that is nearest to the flow tube (elongated microcavities 36). In FIGS. 2G and 2H, there are horizontal 32a and vertical 32b sets of electrodes in encapsulated in the polymer block 30. In FIGS. 2I and 2J, three columns of horizontally-oriented electrodes 32 are electrically connected and a ring electrode 32c is installed "upstream" of the cylindrical microcavities 36. Note also that only one flow tube 38 is required to deliver gas to the entire array of plasma channels. Because the flow tube 38 can be flexible, the entire assembly can be lightweight and handheld, such as by a surgeon or technician. For a medical device, the array can be part of a wand or otherwise be configured to be held and manipulated by a user, such as by a medical professional treating the skin of a patient.

FIGS. 3A-3G and FIG. 4 illustrated preferred fabrication processes for manufacturing microplasma jet arrays such as the arrays in FIGS. 2A-2J. FIG. 4 illustrates an alternative step to FIG. 3B. When the step of FIG. 3B is utilized, then an array like that shown in FIGS. 2A-2B is fabricated. When the alternative step of FIG. 4 is used in place of the step of FIG. 3B, then an array like that shown in FIGS. 2C and 2D is produced. The principal steps in the processes are otherwise the same, so the process flow will be described jointly.

A first step (FIG. 3A) entails the design and construction of a mold, which includes installation of an array of elongated microcavity forming pins, such as microscale needles, rods or similar structure, that will serve to form elongated microcavities in a polymer block. The outer diameter of the pins should be the desired diameter of the elongated microcavities to be formed. The pins can have different shapes to produce elongated microcavities having various cross sections, e.g., diamond, elliptical and circular. The mold can be made from any convenient material that will hold the pins. Experiments even showed that LEGO® toy blocks are suitable to use as a mold, as one example.

The mold in FIG. 3A also includes side shoulders that have a plurality of slots. The slots are offset between rows of the arrays. The top view of FIG. 4A shows slots on both sides of the mold and FIGS. 3B and 4 show that the slots hold electrodes, such as planar electrodes. In FIG. 4, multiple electrodes are held in the slots and vertically separated from each other. This can be achieved in different ways with the shoulders, such as by constructing the shoulders in segments such that a first segment has a slot on its top, electrodes are placed, an additional shoulder is added with more slots, electrodes are placed, and so forth. Other options, such as cross pins and other standard techniques can support multiple levels of electrodes vertically in a slot. The assembly of such a structure can, of course, be automated.

In FIG. 3C, the mold is placed within a container that can contain a volume of heat-curable polymer. In FIG. 3D, the volume of the container is partially or completely filled with a heat-curable polymer. In FIG. 3E, after removing air bubbles, the polymer is thermally cured at a suitable temperature and for a suitable time period that will depend upon the particular polymer. In experiments with siloxane polymers used to date, curing times up to about one hour with temperatures in the range of 80-100° C. were demonstrated to be suitable. After the initial curing, the solidified block is removed from the enclosure (or, alternatively, the enclosure is dismantled), the electrode support structure/mold base is removed, and the entire device is cured a second time at 80-100° C. Subsequently, the channel-forming rods (or pins) are removed and the polymer block is trimmed to the desired size. When the polymer is cured properly, removal of the channel-forming rods is straightforward and the walls of the resulting microcavities are smooth having no pits or imperfections.

FIGS. 5A-5G illustrate another preferred embodiment method for fabrication of an array of microplasma jet devices in a solid block of polymer. In FIG. 5A a mother stamp 50 (patterned silicon wafer shown in top view on left and cross section on right) to form microcavity patterns is formed such as with a silicon wafer or polymeric materials, and in FIG. 5B another stamp 52 for electrode patterns is formed. The stamp 50 has a negative pattern of microchannels. Thus, in FIG. 5C the mother stamp produces in a polymer, such as PDMS, the desired pattern of elongated microcavities that are open until the electrode layers are joined. In FIG. 5D, the stamp has been removed and the polymer is thermally cured. In FIG. 5E, electrodes are completed. The devices is assembled in FIG. 5F by joining the electrode and microcavity blocks, a process that can be repeated with multiple layers. Additional curing joins the separate layers into a unitary, monolithic polymer block in FIG. 5G.

Figure 6:
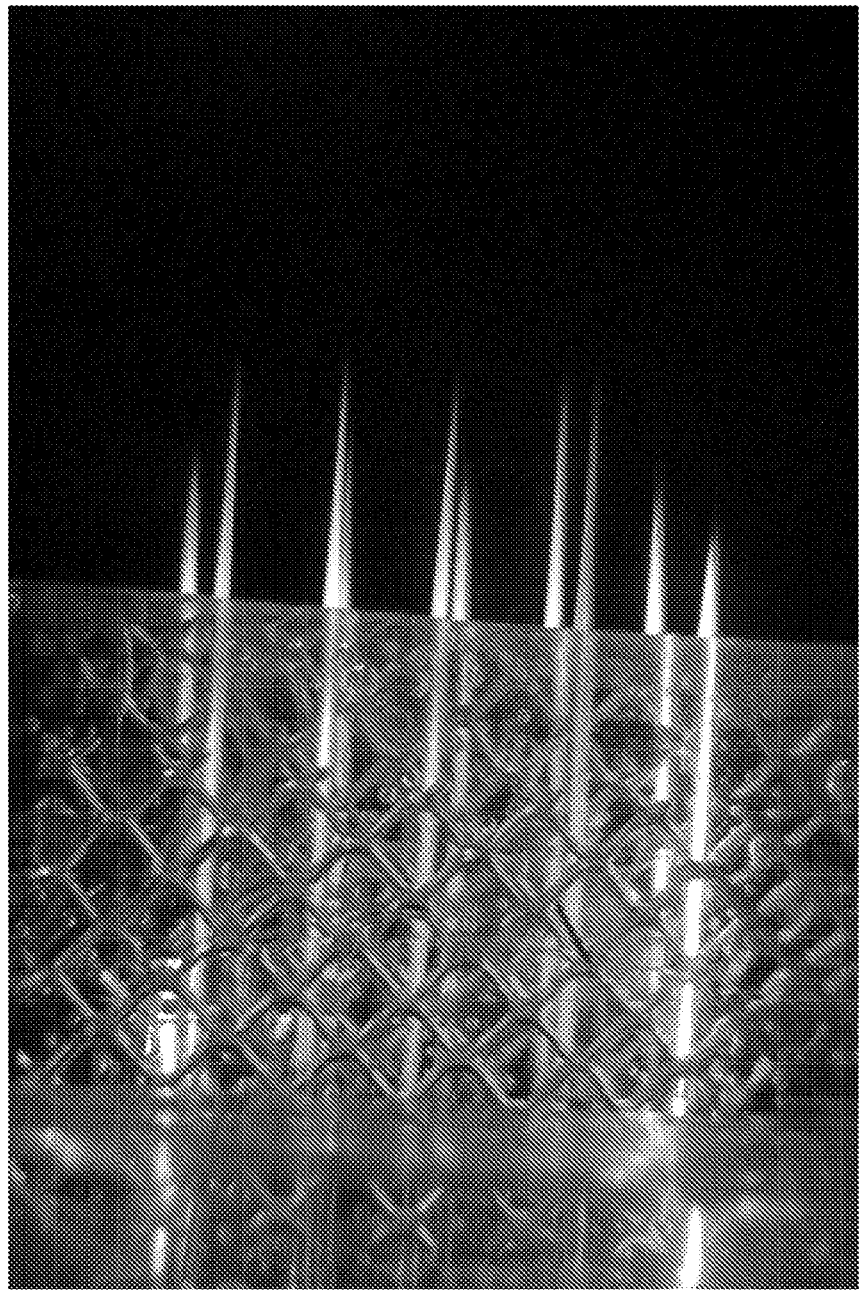
FIG. 6 is photograph of a 5×2 array of microplasma jets fabricated in a monolithic polymer and operated with a He flow rate of ~4.6 SLM.

Experimental devices formed in polymer have produced low temperature microplasma jets. FIG. 6 is photograph of a 5×2 array of microplasma jets operated with a He flow rate of ~4.6 SLM. The diameter of the jets is approximately 300 nm. The microplasma jets each extend several mm into room air and the jets have no observable interaction with each other. Artisans will recognize the important of the fact that such arrays of the invention produce microplasma jets that are uniform in intensity and length.

Devices of the invention, and preferably low temperature microplasma jet devices, can also be formed in metal and metal oxide. With precise control of the microcavity and nozzle shape provided by the invention, the electric field distribution, plasma distribution, jet shape, and temperature distribution can be designed to meet specific objectives, include achieving a temperature microjet that consists of low temperature plasma. The precise shape of the micronozzle and microcavity can be achieved with electrochemical and micromachining techniques, such as aluminum/aluminum oxide ($Al_2O_3$) electrodes or titanium/titanium dioxide ($TiO_2$) electrodes such that the microcavities are bounded by metal electrodes encapsulated within the metal oxide and such that the metal oxide. With the present invention, the microcavity walls and micronozzles are shaped to control the characteristics of the microplasma jet plume that extends out of the microcavity, as a primary objective.

Figure 7E:
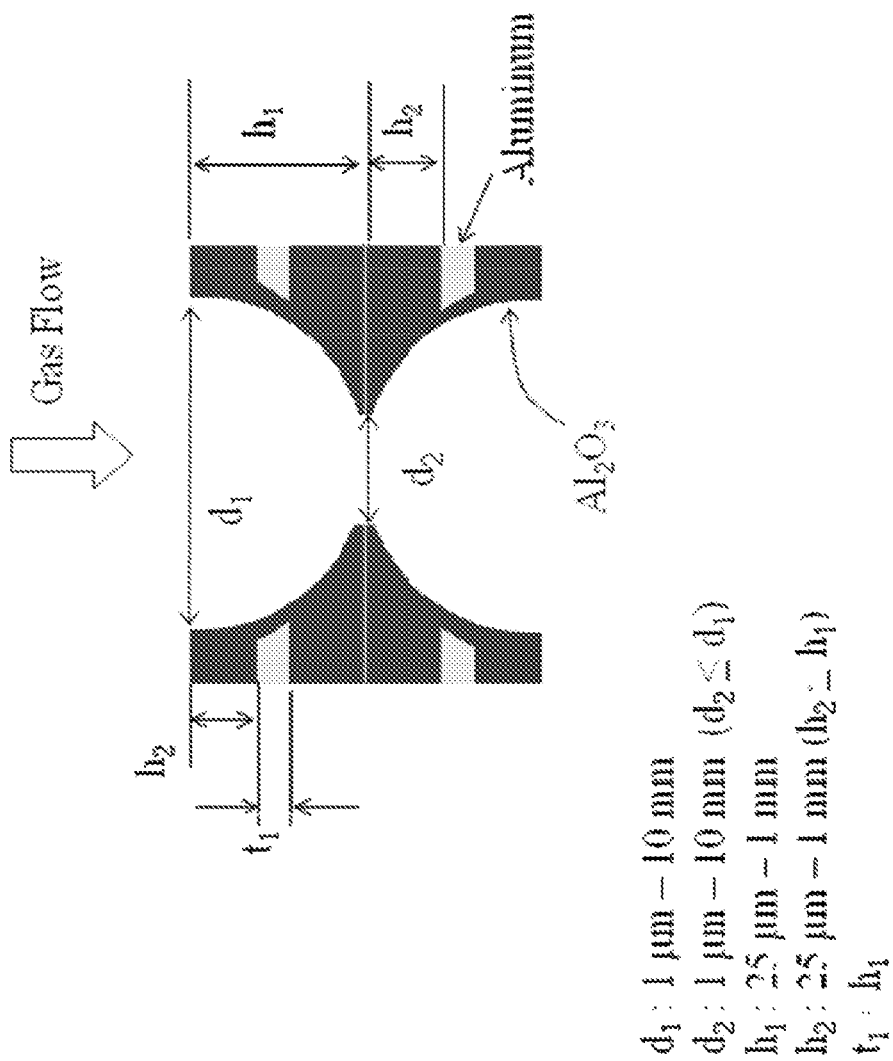

FIGS. 7A-7E illustrate nozzle geometries (not to scale) that have been tested in aluminum/aluminum oxide microplasma jet arrays. FIGS. 7A-7C show two layer devices and FIG. 7D shows a single layer device. In each case, the electrodes are powered by a time-varying voltage, though it is not represented in all of the figures. In FIGS. 7A-7C, Al electrodes 70 lying at the same vertical position comprise one integral electrode connected to one terminal of the power supply and are encapsulated in aluminum oxide ($Al_2O_3$) 72. Shaped microcavities 36 in the two layers of metal/metal oxide are precisely and smoothly contoured to form a micronozzle 74 in the metal oxide 72. Despite having two layers, there is no abrupt transition. In FIG. 7A, dual opposite partial parabolic cross-section shapes have a minimum diameter in the middle where two layers meet, while in FIGS. 7B and 7C, one layer provides a circular cross section that smoothly transitions and is aligned with the narrower (FIG. 7B) or wider (FIG. 7C) portion of the partial parabolic cross-section of the microcavity of the other layer. In FIG. 7D, the electrodes 70 on both sides of the cavity 36 are separate from each other, as indicated. The microcavity is a smooth partial parabolic cross-section inner surface. Thus, in FIG. 7D, a single layer and metal/metal oxide is used and the voltage is applied on opposite sides of the microcavity 36. Some typical dimensions for the FIG. 7A design fall within the ranges that are shown in FIG. 7E. For the microjet arrays of FIGS. 7A and 7C, plasma is formed using adjoining microcavities 36. The microcavities 36 can have different cross-sections. At least one of the cavities 36 is shaped as a micronozzle that controls the shape and properties of low temperature microplasma ejected from the nozzle. Dimensional ranges are provided with labeling in FIG. 7E, and in preferred embodiments the micronozzle has an opening of about 250 μm-700 μm.

FIGS. 8A-8B illustrate a fabrication process for forming arrays like those shown in FIGS. 7A-7E in metal and meal oxide. A preferred metal and metal oxide system that was used in experiments is $Al/Al_2O_3$. Metal foil is provided in FIG. 8A, and is anodized in acids (such as oxalic acid) in FIG. 8B to form a layer of nanoporous alumina on both sides of the foil. A mask is formed, such as by photolithography in FIG. 8C, and after the mask is placed in close proximity or upon nanoporous alumina, then the microcavities are formed. Options for forming the microcavities include electrochemical etching and laser drilling. In another preferred technique, the present inventors have recently demonstrated the use of powder blasting, as disclosed in Eden et al., U.S. application Ser. No. 13/527,842 filed on Jun. 20, 2012 and entitled Arrays of Metal and Metal Oxide Microplasma Devices with defect free oxide. By that technique, microcavities are formed in high quality oxide by powder blasting, via techniques previously applied to substrates such as glass, polymers and ceramics as disclosed in Eden et at. U.S. Published Patent Application No. 2010/0072893, entitled Ellipsoidal Microcavity Plasma Devices and Powder Blasting Formation. The mask is removed in FIG. 8E, and a second anodization or second dielectric layer coating protects portions of the electrodes that were exposed in FIG. 8D. Two or more layers of shaped microcavities and buried electrodes are joined in FIG. 8G to provide finished microcavity jet devices having desired geometries, by combining separate layers formed to have the same or different geometries and dimensions. This is conducted by aligning and bonding the layers.

Figure 9:
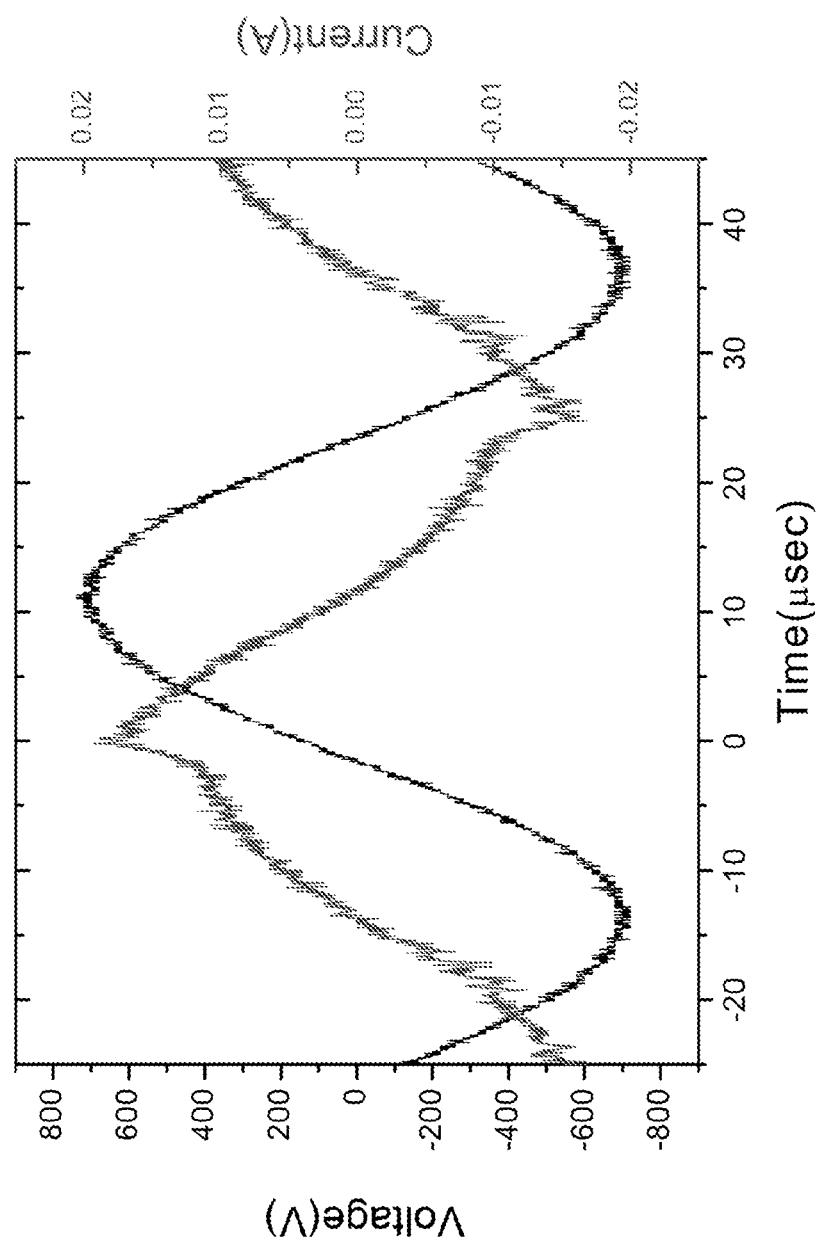
FIG. 9 shows voltage-current (V and I) waveforms for a 5×5 array of jets having the FIG. 7A design.
Figure 10:
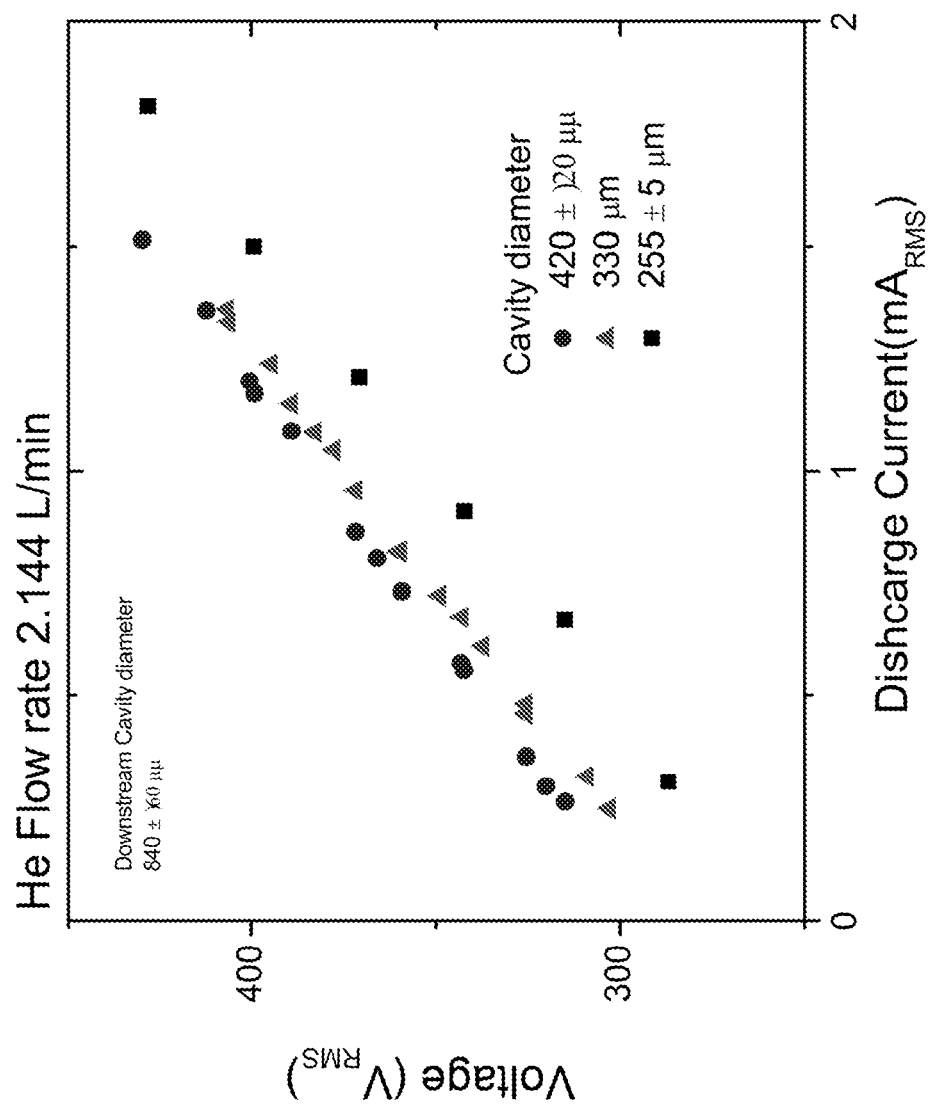
FIG. 10 shows V-I characteristics for single $Al/Al_2O_3$ micronozzles having different values of $d_2$ (see FIG. 7E) ranging from about 255 μm-420 μm.

Voltage-current (V-I) waveforms for a 5×5 array of jets having the FIG. 7A design are shown in FIG. 9. For a driving voltage of 450 $V_{RMS}$, the current increases in magnitude by ~7 mA every time the voltage goes through a zero crossing. The V-I characteristics for single Al/Al$_2$O$_3$ nozzles having different values of d$_2$ (see FIG. 7E) are shown in FIG. 10. For all of the measurements, the He flow through the nozzle was maintained at 2.1 SLM and the exit aperture was 840±60 µm. Notice that the data are linear with a positive slope. Consequently, these devices do not require any external ballast.

Figure 11:
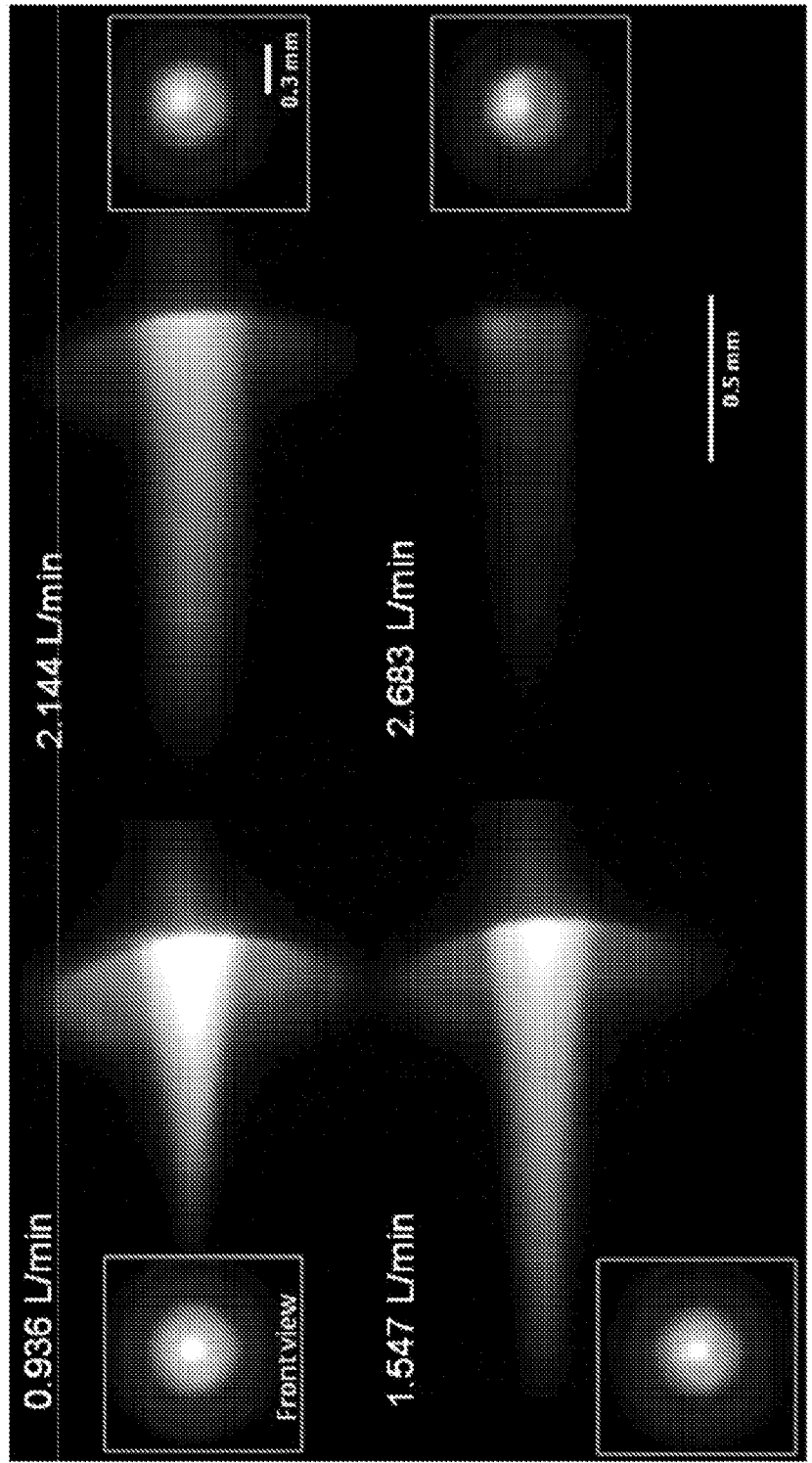
FIG. 11 are a series of photographs of the plasma plume produced by a single $Al/Al_2O_3$ nozzle (for which $d_2$=300 μm and $d_1$=800 μm, configured according to FIG. 7A) at different gas flow rates.
Figure 12:
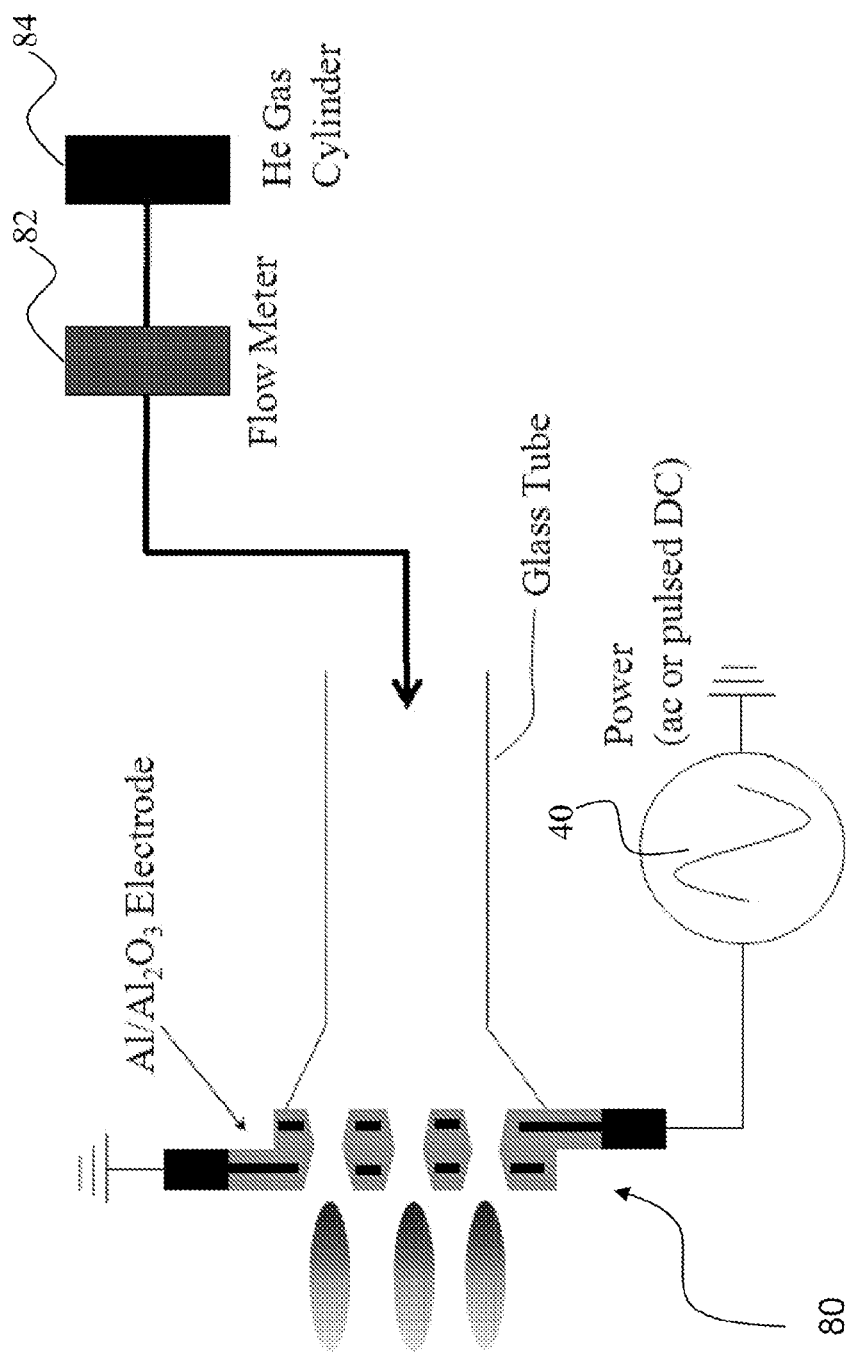
FIG. 12 is a simplified diagram depicting the arrangement adopted for testing arrays of $Al/A_2O_3$ micronozzles.
Figure 13:
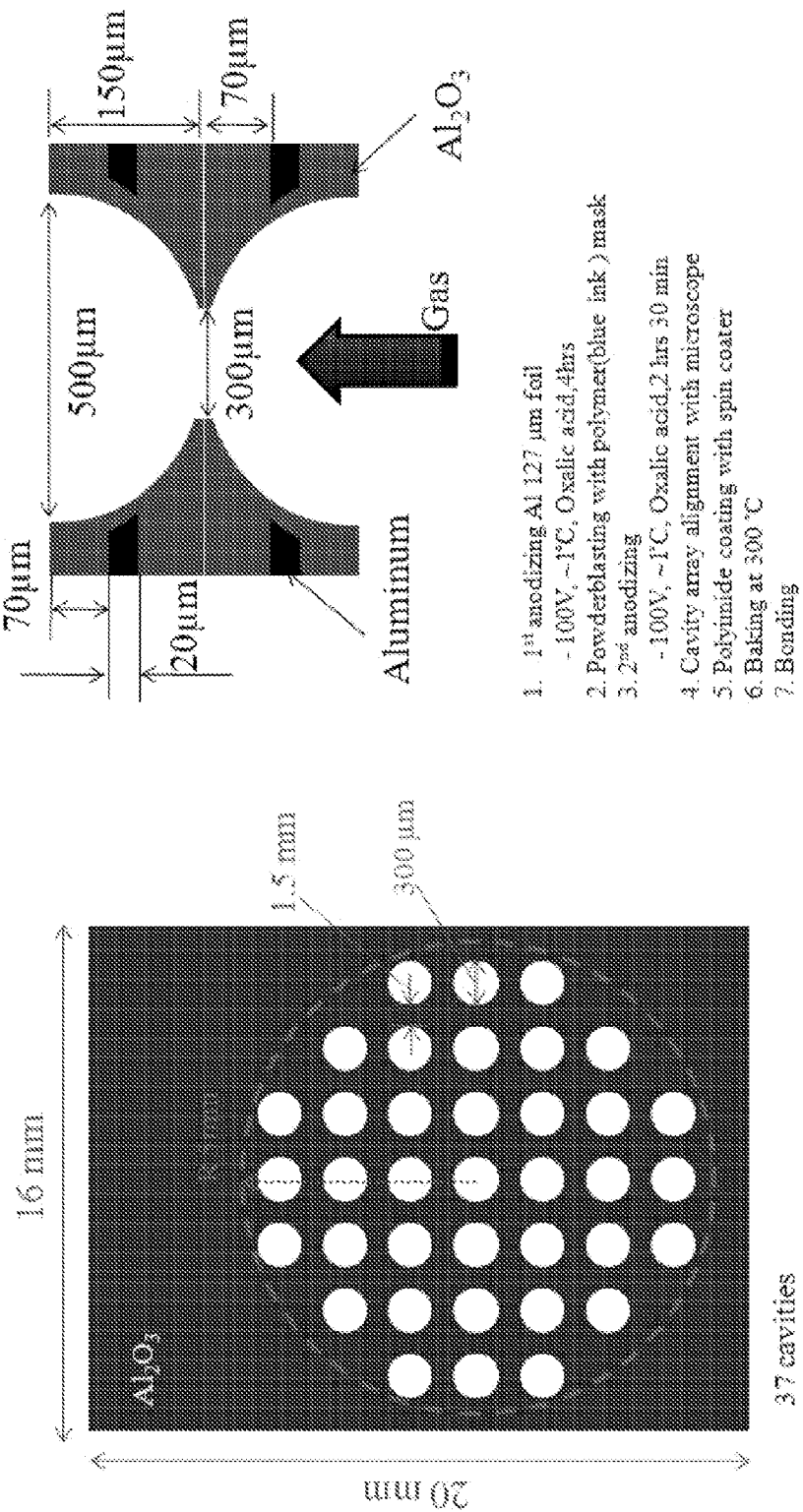
FIG. 13 illustrates the design, dimensions and fabrication conditions for a compact and dense array of microplasma jets that has been fabricated and tested.

A series of photographs of the plasma plume produced by a single Al/Al$_2$O$_3$ nozzle (for which d$_2$=300 µm and d$_1$=800 µm, configured according to FIG. 7A) is shown in FIG. 11. These images were recorded when the flow rate was increased in steps from 0.94 SLM to 2.7 SLM. The longest extent of the visible plasma plume (approximately 1 mm) is obtained for a He flow rate of ~1.5 SLM. Apparent from FIG. 11 is the fact that the microplasma jets are most intense in the throat of the micronozzles (central region in FIGS. 7A and 7E with d$_2$) FIG. 12 is a simplified diagram depicting the arrangement adopted for testing arrays of Al/Al$_2$O$_3$ micronozzles. An array 80 of devices like those illustrated in FIG. 7A was hooked up to a glass but and a flow meter 82 controlled flow from an He Gas supply 84. FIG. 13 illustrates design, dimensions and fabrication conditions for a large array of microplasma jets.

Figure 14:
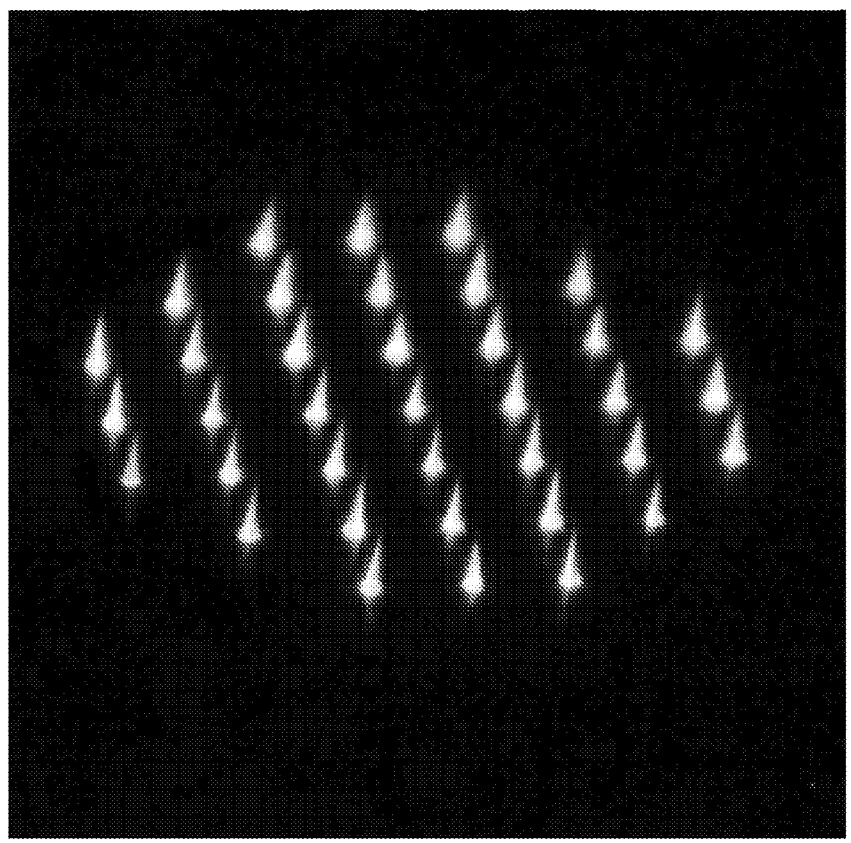
FIG. 14 includes photographs of a completed array of FIG. 13 sealed to a ¼" o.d. glass tube (left) and the entire array in operation with the gas and extending microplasma jets into room air.

Comprising 37 Al/Al$_2$O$_3$ nozzles, the FIG. 13 array is built into a circle having a diameter of only 10 mm (1 cm). The diameter of the throat of each nozzle (d$_2$) is 300 m and the pitch for the array is 2.1 mm. The entire array is fabricated in two sheets of Al foil, each having dimensions of 16 mm×20 mm. When the nozzles are completed, the Al electrodes have a thickness of only 20 µm. A photograph of this array is presented in FIG. 14. The uniformity of the plasma plumes across the array is obvious. The array was sealed to a single, 0.25 inch dia. glass tube.

It must be emphasized that this technology stands in sharp contrast to all commercially developed microplasma jet arrays developed in the past. All have been large tubes bundled together to yield a heavy cumbersome package. Making the microplasma plume in the form of a "blade" (i.e., having a rectangular cross-section with a high (>5:1) aspect ratio) is also feasible with the devices of the invention and will facilitate the processing of large surface areas.

Figure 15:
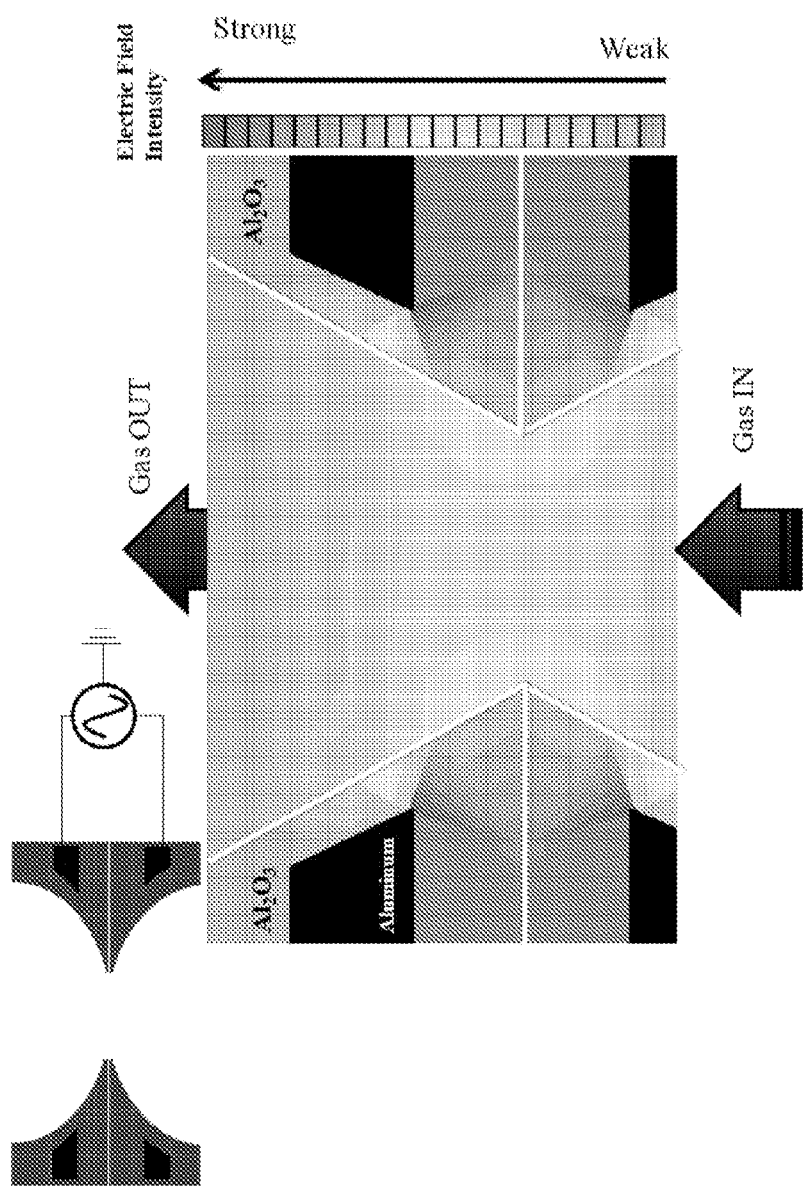
FIGS. 15 and 16 illustrate that different electric field profiles can be predetermined for preferred microplasma jet arrays and devices of the invention.
Figure 16:
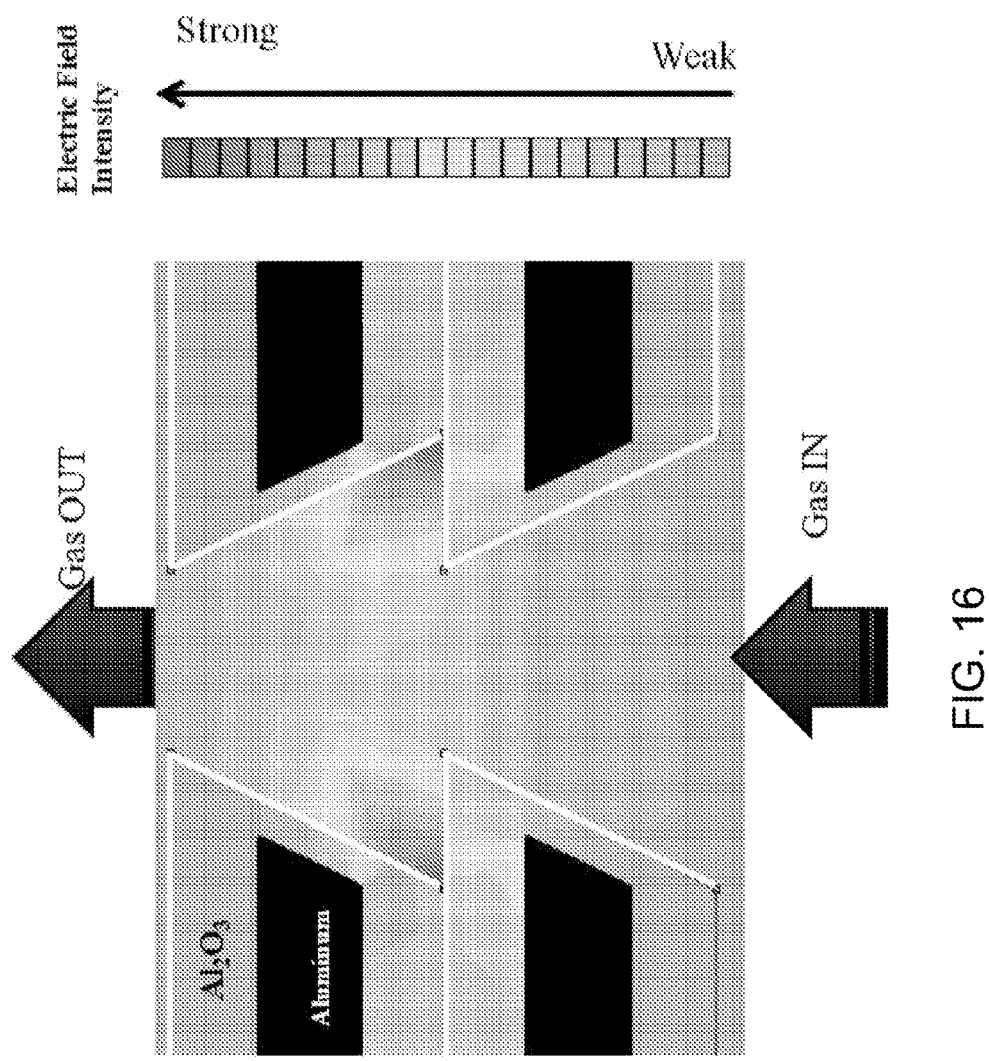

FIGS. 15-16 are the result of simulations and illustrate that different electric field profiles can be designed and built into preferred microplasma jet arrays and devices of the invention. In FIG. 15, the electric field strength is at its peak value in the throat of the nozzle. However, if the two layers are bonded differently from the FIG. 7A design such that a "double-arrowhead" style structure is formed (FIGS. 16 and 17), the peak electric field is formed in a crevice between the two sections. Thus, not only the flow characteristics of these microplasma jets are subject to manipulation but the delivery of electrical power to the plasma is also controllable.

Figure 17A:
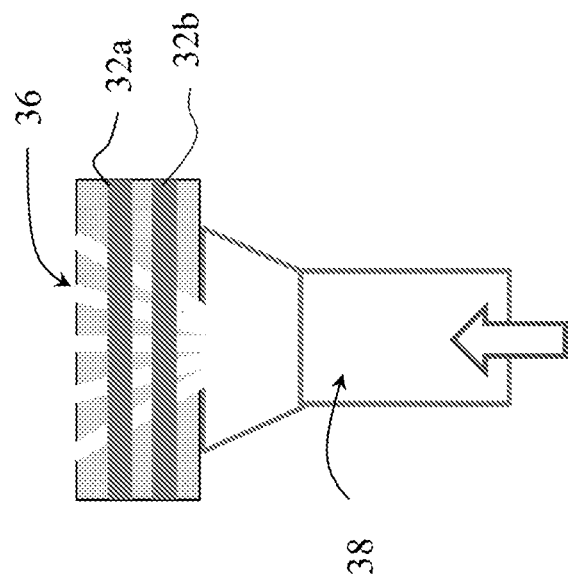
FIGS. 17A-17B are multiple views of additional preferred embodiment arrays of low temperature microplasma jet devices of the invention.
Figure 17B:
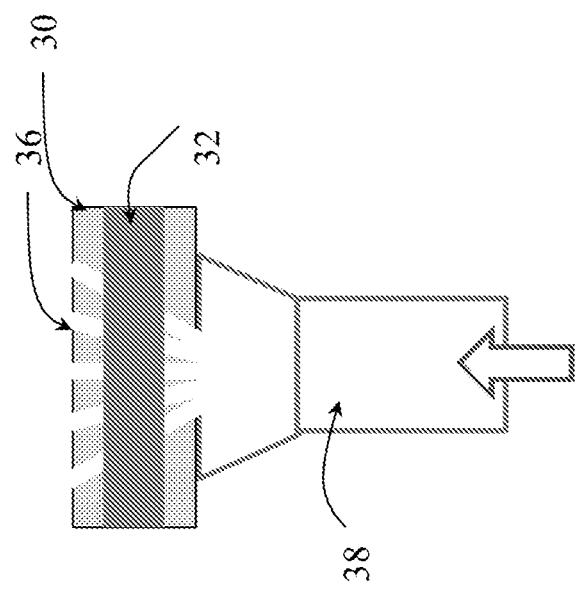

FIGS. 17A and 17B illustrate embodiments of the invention that provide divergent microjet plasma flows. In FIG. 17A, the electrode configuration is identical to FIG. 2A, but the microcavities are non-parallel so that individual jets will diverge in the divergent pattern established by the microcavities. FIG. 17B shows an array that uses the electrode configuration of FIG. 2H but also has the non-parallel microcavities 36 that provide for microplasma jets that are emitted in a divergent pattern. This divergent pattern can extend microjet plasma beyond the physical dimensions of the array.

FIGS. 18A and 18B illustrate embodiments that can simultaneously provide microjet plasmas that are formed in distinct gases or vapors. Gases A-E are fed to separate microplasma jet devices in the array. Radicals and excited species produced in separate microjet plasma devices can react with each other or a surface or object after exiting the devices after emerging from the micronozzles of devices in the array. In FIG. 18B, the microplasma jet devices are oriented with respect to each other to produce a convergent pattern. This pattern aids mixing and reaction of the microplasma jets if that is the desired result. The embodiments of FIGS. 18A and 18B provide the ability to manipulate and control plasma chemistry at atmospheric pressures. This ability is useful for a variety of applications including film deposition, film etching, spectroscopy and materials analysis.

Figure 19A:
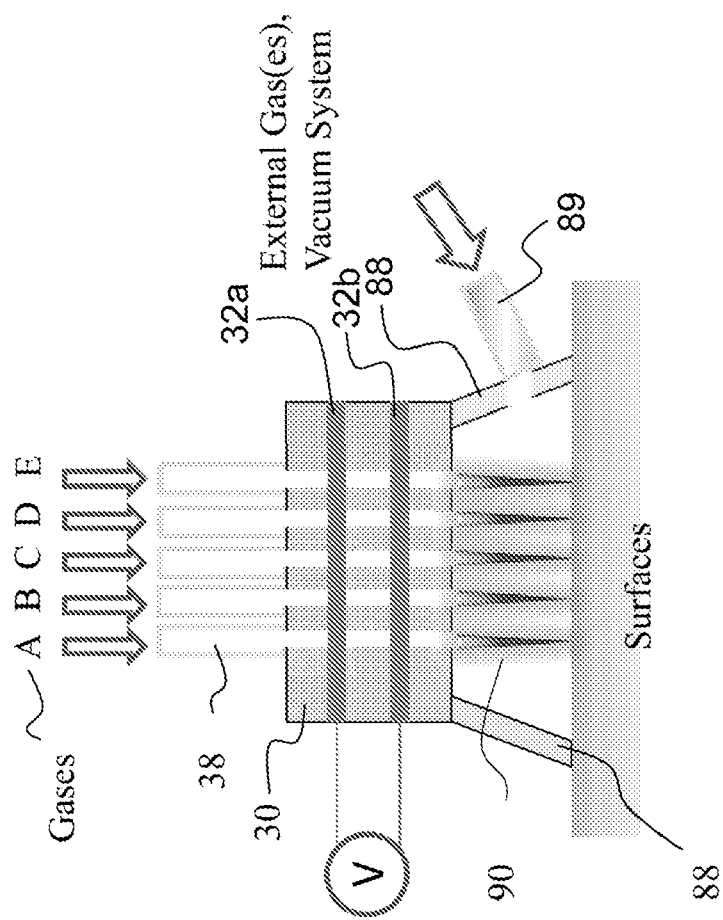
FIGS. 19A-19C illustrate some different shaped devices that can be produced based upon flexible microplasma jet devices of the invention.
Figure 19B:
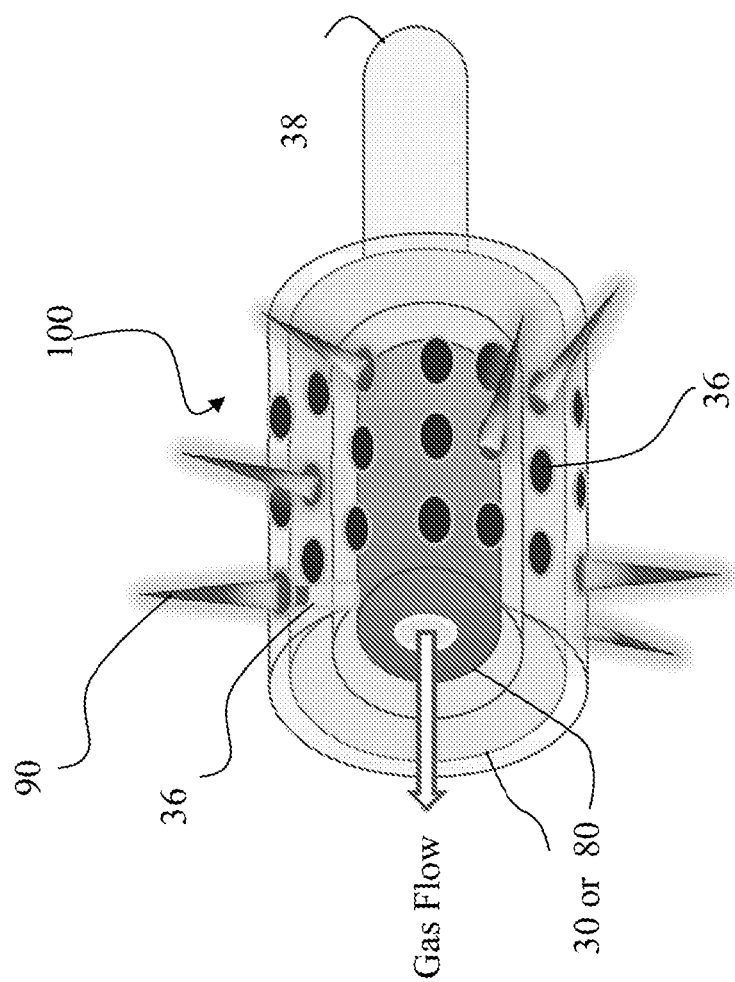
Figure 19C:
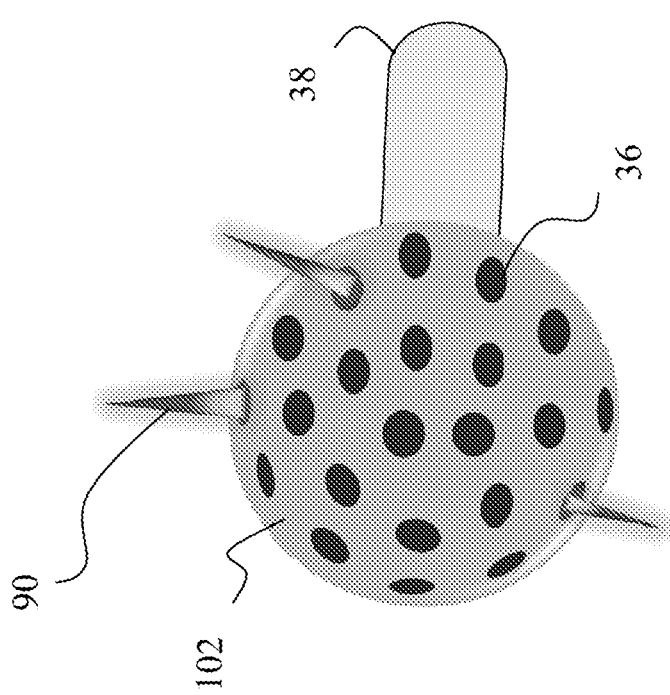

FIGS. 19A-19C illustrate some different shaped devices that can be produced based upon flexible microplasma jet devices of the invention. The device of FIG. 19A is in the form of a wand, and its exit plane forms a flat surface. The microcavities (referred to in conjunction with the flow tube as flow channels) can be densely packed as in FIGS. 13 and 14. The embodiment of FIG. 19A is similar to the FIG. 18A embodiment, but also includes a sealing collar 88. The collar 88 permits evacuation of the volume via a tube 89 between the array and a surface and for the volume to be replaced with a gas or vapor of interest. The collar 88 can be formed from a flexible polymer that defines a seat that allows it to be affixed without adhesive or can be attached via adhesive. Such an array provides a unique ability, as past plasma jet devices known to the present inventors restricted plasma jet interaction to ordinary air (unless used in a separate chamber). With the FIG. 19A device, microplasma jets 90 can interact with other gases and vapors without when the array is surrounded by air in an open environment. An example application is treatment of human tissue. Once sealed, the volume between tissue and a device of FIG. 19A can be replaced with an atmosphere of gas consisting of NO in a rare gas. Interaction of the plasma jets with this mixture in close proximity to the tissue can produce existed NO and O, which is expected to have therapeutic value.

As the metal/metal oxide arrays or polymer arrays can be thin and flexible, and since the polymer embodiments described above can be cast into a wide variety of shapes, other geometries are also possible, such as the cylinder 100 arrangement of FIG. 18B and the ball of FIG. 18C. The different shaped devices can be useful to allow microplasma jets to be directed in a controlled fashion at different shaped targets.

Experimental devices have been formed to demonstrate the invention. Polymer based arrays have been fabricated with microplasma jets in the range of 100-300 µm in diameter. Flexible, visible and ultraviolet-transparent polymer was used. An example experimental array included 10 jets have been made (and tested) in a cross-sectional area of 0.16 cm$^2$. Arrays with as many as 64 jets have been experimentally demonstrated to date. The fabrication process enable the formation of arrays with many more microplasma jets. Metal and metal oxide devices have also been formed in aluminum and aluminum oxide. Fabricated nozzles have precisely-controlled surfaces that allow for the plasma effluent to have particular properties with regard to temperature and velocity. The microplasma jets are believed to have smaller diameters than any elsewhere in the world and can be bundled together to have many microplasma jets together in a single, lightweight package.

Artisans will recognize that the microplasma jets of the invention have many applications. A preferred application is in a medical device for the treatment of human tissue (skin, muscle, etc.). Microplasmas jets of the invention are of particular value for this application because the plasma produced is of low temperature and will not burn tissue. Importantly, though, the microplasma jet arrays of the invention also produce energetic particles and short wavelength light that appear to be effective in promoting healing and disinfection. The large densities of excited species produced in these jets allow for materials modification such as the crystallization of thin polycrystalline Si films. Also, the conversion of the phase of a thin region at the surface of a glass plate will also be possible.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A microplasma jet device comprising:
   a monolithic polymer;
   one or more elongated microcavities within said monolithic polymer, said elongated microcavities extending entirely through said monolithic polymer and being dimensioned to accept gas flow therethrough;
   electrodes buried within said monolithic polymer, disposed proximate to said elongated microcavities such that said electrodes can generate and sustain plasma within said elongated microcavities, but isolated from said elongated microcavities by portions of said monolithic polymer;
   a gas supply to direct gas flow through said elongated microcavities; and
   a power supply to power said electrodes to generate plasma within said elongated microcavities.

2. The device of claim 1, comprising an array of said elongated microcavities.

3. The device of claim 1, wherein said gas supply supplies a low molecular weight atomic species.

4. The device of claim 3, wherein the low molecular weight atomic species comprises Helium, Neon or Argon.

5. The device of claim 1, wherein said one or more elongated microcavities has a length to diameter ratio of at least 10:1.

6. The device of claim 1, wherein said electrodes comprise one of foils, rods wires or metal layers.

7. The device of claim 6, comprising a plurality of said elongated microcavities with said electrodes disposed therebetween.

8. The device of claim 7, wherein said elongated microcavities are arranged in rows and said electrodes are interleaved with said rows.

9. The device of claim 8, wherein said electrodes are arranged to permit voltage to be applied parallel to said microcavities.

10. The device of claim 7, further comprising an electrode upstream of said microcavities.

11. The device of claim 6, wherein said gas supply comprises a flexible tube and an exit surface of said monolithic polymer comprises a flat plane.

12. The device of claim 11, further comprising a sealing collar permitting said exit surface to be sealed against a surface with a closed volume therebetween.

13. The device of claim 6, wherein said gas supply comprises a plurality of gas supply tubes, wherein different ones of said gas supply tubes supply different plasma media to different ones of said microcavities.

14. The device of claim 6, wherein said polymer forms a ball shape.

15. The device of claim 6, wherein said polymer forms a cylinder.

16. The device of claim 5, wherein said microcavities are densely packed, having more than 30 per 1 cm diameter circle.

17. A microplasma jet device comprising:
   at least one layer of metal/metal oxide having at least one shaped microcavity extending completely therethrough, said at least one layer having buried metal electrodes within metal oxide, wherein the microcavity is shaped in the metal oxide to define at least one micronozzle that is shaped and dimensioned to produce a focused microplasma jet emission;
   a gas supply to direct gas flow through said microcavity; and
   a power supply to power said electrodes to generate plasma within said elongated cavities.

18. The array of claim 17, wherein the micronozzle has a diameter in the range of about 250 µm-700 µm.

19. The device of claim 17, wherein said gas supply supplies a low molecular weight atomic species.

20. The device of claim 19, wherein the low molecular weight atomic species comprises Helium, Neon or Argon.

21. The device of claim 17, wherein said at least one layer of metal/metal oxide comprises a single layer and said microcavity comprises a smooth partial parabolic cross-section.

22. The device of claim 17, wherein said at least one layer of metal/metal oxide comprises a plurality of layers and said microcavity comprises a smooth partial parabolic cross-section in one layer that transitions to another smooth partial parabolic cross-section in another layer.

23. The device of claim 17, wherein said at least one layer of metal/metal oxide comprises a plurality of layers and said microcavity comprises a smooth partial parabolic cross-section in one layer that transitions to another circular cross-section in another layer.

24. A method of making a polymer microplasma jet array, the method comprising:
   installing an array of elongated forming pins in a mold;
   disposing electrodes relative to said forming pins within the mold;
   filling the mold with polymer;
   curing the polymer;
   removing the forming pins to leave extended microcavities in a monolithic block of polymer; and
   attaching a gas supply to supply plasma medium to the microcavities.

25. A method of making a polymer microplasma jet array, the method comprising:
   providing a mother stamp having a negative pattern of microchannels;
   forming a polymer block with microchannels using the mother stamp;
   providing another stamp to create polymer with channels for electrodes;
   creating polymer electrode layers with the another stamp having electrodes in polymer channels;
   joining and curing the polymer block and the polymer electrode layers to form the polymer microplasma jet array.

* * * * *